United States Patent
Spinelli et al.

(10) Patent No.: US 6,507,593 B1
(45) Date of Patent: Jan. 14, 2003

(54) STEP-TUNABLE EXTERNAL-CAVITY SURFACE-EMITTING SEMICONDUCTOR LASER

(75) Inventors: Luis A. Spinelli, Sunnyvale, CA (US); Juan L. Chilla, Sunnyvale, CA (US); Andrea Caprara, Menlo Park, CA (US); Briggs Atherton, Derry, NH (US)

(73) Assignee: Coherent, Inc., Santa Clara, CA (US)

( * ) Notice: Subject to any disclaimer, the term of this patent is extended or adjusted under 35 U.S.C. 154(b) by 0 days.

(21) Appl. No.: 09/963,607

(22) Filed: Sep. 24, 2001

(51) Int. Cl.[7] ............................................. H01S 3/10
(52) U.S. Cl. ....................................... 372/20; 372/98
(58) Field of Search ............................... 372/20, 70, 96, 372/98

(56) References Cited

U.S. PATENT DOCUMENTS

| | | | |
|---|---|---|---|
| 5,050,179 A | 9/1991 | Mooradian | 372/44 |
| 5,131,002 A | 7/1992 | Mooradian | 372/50 |
| 5,289,485 A | 2/1994 | Mooradian | 372/45 |
| 5,291,502 A | 3/1994 | Pezeshki et al. | 372/20 |
| 5,436,920 A | 7/1995 | Minemoto et al. | 372/21 |
| 5,461,637 A | 10/1995 | Mooradian et al. | 372/92 |
| 5,627,853 A | 5/1997 | Mooradian et al. | 372/92 |
| 5,771,253 A | 6/1998 | Chang-Hasnain et al. | 372/20 |
| 5,991,318 A | 11/1999 | Caprara et al. | 372/22 |
| 6,041,071 A | 3/2000 | Tayebati | 372/64 |
| 6,097,742 A | 8/2000 | Caprara et al. | 372/22 |
| 6,285,702 B1 | 9/2001 | Caprara et al. | 372/92 |
| 6,366,592 B1 * | 4/2002 | Flanders | 372/18 |
| 6,438,147 B1 * | 8/2002 | Roychoudhuri et al. | 372/20 |

FOREIGN PATENT DOCUMENTS

| | | | |
|---|---|---|---|
| DE | 25 22 338 A1 | 12/1975 | H01S/3/10 |
| DE | 42 28 862 | 3/1994 | H01S/3/109 |
| DE | 43 15 580 A1 | 11/1994 | H01S/3/043 |
| WO | WO 93/14542 A | 7/1993 | H01S/3/109 |
| WO | WO 94/15386 | 7/1994 | H01S/3/094 |
| WO | WO 95/25366 | 9/1995 | H01S/3/085 |
| WO | WO 98/43329 | 10/1998 | H01S/3/085 |

OTHER PUBLICATIONS

W–H. Xiang et al., "Femtosecond external–cavity surface–emitting InGaAs/InP multiple–quantum–well laser," *Optics Letters*, vol. 16, No. 18, Sep. 15, 1991, pp. 1394–1396.

J.V. Sandusky et al., "A CW External–Cavity Surface–Emitting Laser," *IEEE Photonics Technology Letters*, vol. 8, No. 3, Mar. 1966, pp. 313–315.

M. Kuznetsov et al., "High–Power (>0.5–W CW) Diode–Pumped Vertical–External–Cavity Surface–Emitting Semiconductor Lasers with Circular $TEM_{00}$ Beams," *IEEE photonics Technology Letters*, vol. 9, No. 8, Aug. 1997, pp. 1063–1065.

A. Rosiewicz et al., "Optical pumping improves VCSEL performance," *Laser Focus World*, Jun. 1997, pp. 133–136.

W.J. Alford et al., "Intracavity frequency doubling of an optically–pumped, external–cavity surface–emitting semiconductor laser," Advanced Solid State Laser Conference, Sandia National Laboratories, SAND–98–2108C, CONF–990105, Dec. 31, 1998, 5 pages in length.

* cited by examiner

Primary Examiner—James Davie
(74) Attorney, Agent, or Firm—Stallman & Pollock LLP

(57) ABSTRACT

A laser for delivering laser radiation at a selected one of a plurality of equally-spaced frequencies extending over a frequency range includes a laser resonator defined by two end mirrors. The resonator includes a surface-emitting semiconductor multilayer gain-structure in optical contact with one of the mirrors. A third mirror located in the laser resonator forms an etalon with that mirror. The third mirror is movable for adjusting a peak transmission frequency of the etalon to align with the selected frequency. The resonator end mirrors are spaced apart by an optical distance selected such that the frequency and frequency-spacing of possible longitudinal lasing modes of the resonator correspond with the plurality of equally-spaced frequencies. When the peak transmission frequency of the etalon is aligned with the selected frequency the laser resonator delivers radiation in a single longitudinal mode at the selected frequency.

21 Claims, 9 Drawing Sheets

STEP-TUNABLE EXTERNAL-CAVITY SURFACE-EMITTING SEMICONDUCTOR LASER

TECHNICAL FIELD OF THE INVENTION

The present invention relates generally to external-cavity, surface-emitting semiconductor lasers. It relates in particular to an external-cavity, surface-emitting semiconductor laser that is tunable in discrete equally-spaced frequency steps corresponding to frequencies of optical channels in an optical communication system.

DISCUSSION OF BACKGROUND ART

In optical communications systems, information is transmitted along an optical fiber as a modulated beam of light. In one preferred optical communication arrangement, wavelengths for the light beam are in a range between about 1515 nanometers (nm) to about 1565 nm, corresponding to a frequency range from about 198,000 gigahertz (GHz) to about 190,000 GHz. In a scheme referred to as dense wavelength-division-multiplexing (DWDM) the frequency range is partitioned into 40 channels at 100 GHz intervals. A trunk optical fiber may carry up to 40 different beams at 40 different wavelengths, one corresponding to each channel. The different-wavelengths (optical-carrier) beams are generated by InGaAsP diode-lasers, one for each channel. The output of each laser is modulated to encode the information to be transmitted onto the laser-beam provided by the laser. Communications channels are separated from or added to the trunk optical fiber by wavelength-selective couplers.

In order to accommodate increasing optical communications traffic DWDM systems that will include channels spaced apart by 50 GHz and eventually 25 GHz are being developed.

In current optical communications systems, conventional edge-emitting diode-lasers are typically used to provide the laser beam. These diode-lasers are arranged to deliver light in a single longitudinal mode (single frequency). In the manufacture of diode-lasers it extremely difficult, if not impossible to provide that the output frequency of a diode-laser corresponds with sufficient precision to the frequency of a particular optical communications channel. In order to overcome this difficulty the lasers are usually arranged to be continuously tunable (usually by temperature tuning) to the required channel frequency. Temperature tuning is sufficiently accurate and stable that for current systems with 100 GHz channel spacing a diode-laser tuned to a particular channel frequency can be retained at that frequency purely by maintaining the temperature of the diode-laser with about ±1.0° C. of the tuning temperature of the diode-laser.

In a system with 50 GHz or 25 GHz channel spacing, simple temperature control measures alone would be insufficient to retain an edge emitting diode-laser tuned to a particular channel frequency. In this case it would be necessary to provide a closed-loop arrangement for locking the output frequency to a frequency standard such as an etalon or a fiber Bragg grating. By way of example such an arrangement may involve generating an error signal corresponding to a variation of the laser output frequency from the channel frequency, and using the error signal to adjust the temperature of the diode-laser to restore the output frequency to the channel frequency. Controlling 80 diode-lasers (one per channel) in this way would add to the cost and complexity of the DWDM system. Accordingly, there is a need for a laser that can be passively retained at a channel frequency in a 50 GHz spaced DWDM system.

SUMMARY OF THE INVENTION

The present invention is directed to a laser than can be tuned to any selected one of a plurality of equally-spaced frequencies. Such a plurality of equally-spaced frequencies, for example, can be frequencies corresponding to channel frequencies in a DWDM optical communications system.

In one aspect, the inventive laser comprises, a laser resonator terminated by first and second mirrors. A surface-emitting semiconductor multilayer gain-structure is located in said laser resonator in optical contact with the first mirror. A pumping arrangement is provided for energizing the multilayer gain-structure and causing laser radiation to be generated in the laser resonator. The laser resonator is configured such that the laser radiation can be generated at any time in only one of a plurality of possible longitudinal oscillating modes. The first and second mirrors are spaced apart by an optical distance selected such that the frequency and frequency-spacing of the possible longitudinal lasing modes correspond with the plurality of equally-spaced frequencies. An optical filter is located in the laser resonator. The optical filter is tunable for tuning the peak transmission frequency thereof. The first optical filter has a bandwidth arranged such that when said peak transmission frequency of said first optical filter is tuned to a value about equal to the selected one of the plurality of equally-spaced frequencies, the laser resonator delivers radiation in a single longitudinal mode only at the selected one of the plurality of equally-spaced frequencies.

As the frequency of the laser operating modes is determined by the spacing of the first and second mirrors these frequencies can be fixed to the extent that the distance between the first and second mirrors can be fixed. One preferred separation distance for the first and second mirrors is about 6.0 millimeters (mm). This mirror spacing provides a frequency spacing of 25 GHz. If the first and second mirrors are fixed on an aluminum base a temperature variation of ±1.0° C. will cause a frequency variation of only 0.6 GHz. This frequency variation is within the channel width of DWDM communication system.

In a preferred embodiment of the inventive laser, the first optical filter is an etalon. A third mirror is located in said laser resonator and spaced-apart from the first mirror and the gain-structure. The etalon is formed by the first and third mirrors, and has a peak transmission frequency determined by the optical distance between the first and third mirrors. The third mirror is selectively movable with respect to the first mirror for tuning the peak transmission frequency of the etalon.

In another preferred embodiment the first and third mirrors are spaced apart by a distance that, absent any measure to the contrary, would provide a frequency spacing of a first series of possible longitudinal oscillating modes that was a sub multiple of a desired frequency spacing, with only a subset thereof corresponding to the plurality of equally-spaced frequencies. In order to reduce the possible oscillating modes to correspond with the plurality of equally-spaced frequencies a second optical filter is included in the laser resonator. The second optical filter has a plurality of transmission peaks that correspond to the subset of the first set of oscillating modes and has a bandwidth (of transmission peaks) selected to suppress oscillation at all other longitudinal oscillating modes.

Preferably the second optical filter is an etalon. The etalon is preferably formed by supporting the third mirror on one of first and second opposite surfaces of a transparent substrate. The etalon is formed between the third mirror and the other of the first and second opposite surfaces of the substrate. The optical thickness of the substrate is selected such that transmission peaks of the etalon correspond to the plurality of equally-spaced frequencies.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the invention.

DETAILED DESCRIPTION OF THE INVENTION

Figure 1:
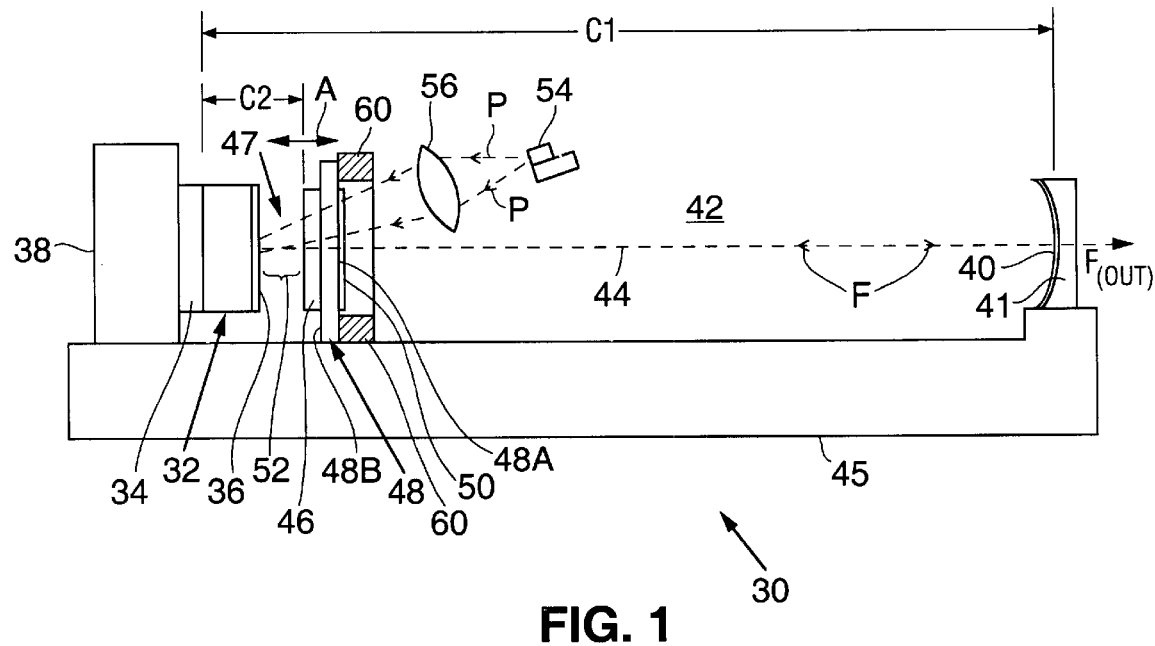
FIG. 1 schematically illustrates one preferred embodiment of a step-tunable OPS laser in accordance with the present invention including a resonator formed between first and second mirrors, a gain-structure in the resonator in optical contact with the first mirror and a partially-transmitting, piezoelectrically-driven, movable, third mirror in the resonator arranged to form a tunable etalon with the first mirror.

Turning now to the drawings, wherein like features are designated by like reference numerals, FIG. 1 schematically illustrates one preferred embodiment 30 of a step-tunable laser in accordance with the present invention. The inventive laser is configured to deliver radiation at a selected one of a plurality of equally-spaced output frequencies (mode-frequencies) corresponding to equally-spaced channel frequencies in a DWDM optical communication system. Laser 30 includes, as a gain-element, a surface-emitting multilayer semiconductor gain-structure 32. Gain-structure 32 is in optical contact with a mirror 34 and is surmounted by an antireflection coating 36. Mirror 34 is in thermal contact with a substrate or heat sink 38. Another mirror 40, supported on a substrate 41 is aligned with and spaced apart from mirror 34 to form a stable resonator 42 that allows only one transverse mode to oscillate therein. Laser radiation generated in resonator 42 circulates therein generally along a longitudinal axis 44 of the resonator as indicated by arrows F.

Mirror 34 is a maximally-reflecting mirror, for example, having a reflectivity greater than about 99%. Mirror 40 is partially-transmitting mirror for radiation F and has a reflectivity less than the reflectivity of mirror 34. This allows a portion of radiation F to be delivered by the resonator as output radiation as indicated by arrow $F_{(OUT)}$.

Gain-structure 32 includes a plurality of optical-gain-providing active layers (not shown) spaced apart by spacer layers (not shown). The active layers are spaced apart from each other by an optical distance of one half-wavelength of radiation F at about the center wavelength of the gain bandwidth of the active layers. As such a gain-structure is well known to practitioners of the art, a detailed description of the gain-structure is not presented herein. Further details about such gain structures and OPS lasers of this type can be found in U.S. Pat. No. 6,285,702, incorporated herein by reference.

The arrangement of gain-structure 32 and its position in resonator 42 provides that the resonator, at any time, can oscillate at only one of a plurality of possible longitudinal oscillation modes (frequencies) of the resonator. The number of such possible modes is determined, inter alia, by the gain bandwidth of the active layers of gain-structure 32 and the optical length C1 between mirrors 34 and 40. It should be noted here that optical length C1 is determined by the physical separation of mirrors 34 and 40 and by the thickness and refractive index of any optical components or structures located in the resonator on axis 44 thereof. Optical length C1 is selected or set such that at least a subset of the possible oscillation frequencies of resonator 42 corresponds to channel frequencies of the optical communication system. Heat sink 38 and substrate 41 of mirror 40 can be secured to a rigid base 45 such that, once distance C1 is set, the possible oscillation frequencies of resonator 42 will remain essentially the same. The terminology "essentially the same", here, means within limits determined, inter alia, by the thermal expansion coefficient of base 45 and the degree to which the temperature of base can be controlled. Passive temperature control techniques allow for temperature to be controlled within about ±1.0° C. This variation will produce a frequency shift of only about 0.6 GHz.

While resonator 42 may resonate in only one of the possible oscillation modes, absent any provision to the contrary, it would not be possible to predict which of those possible modes would oscillate. Accordingly, it would not be possible to predict the laser-radiation frequency that the resonator would deliver. In order to select a desired oscillating mode or output frequency of resonator 42, a mirror 46 is provided within the resonator. Mirror 46 has a reflectivity about equal to or less than the reflectivity of mirror 40.

Mirror 46 is supported on a surface 48B of a substrate 48. On the surface (48A) of substrate 48 opposite mirror 46 is an antireflection coating 50. This prevents the surface from behaving as a mirror and contributing unwanted or uncontrolled etalon effects. Mirror 46 is aligned parallel with mirror 34 such that, together, the mirrors define an etalon 47 having an optical cavity length C2. Cavity length C2 is determined by the physical spacing of mirrors 34 and 40 and the refractive index and thickness of layers of gain-structure 32 and antireflection coating 36 thereon.

Gain-structure 32 is optically pumped (energized). Optical pump light P is delivered directly by a single-mode diode-laser 54 and focused by an optical system 56, through mirror 46, into gain-structure 32 via antireflection coating 36 thereon. The pump light may also be delivered to optical system 56 from a remotely located diode-laser via an optical fiber. Mirror 46 and antireflection coating 36 are transparent to the wavelength of pump light P. Pump light P is preferably provided by a diode-laser or an array of diode-lasers.

Optical width C2 is selected such that etalon 47 has a free spectral range (FSR) about equal to or greater than the gain bandwidth of gain-structure 32. By way of example, one preferred gain-structure 32 has active layers of indium gallium arsenide (InGaAs) providing a peak gain at a wavelength between about 1500 and 1565 nm, i.e., a frequency between about 198,000 and 190,000 GHz. Such a gain-structure has a gain bandwidth of about 40 nm or 5,000 GHz. A preferred length C2, for such a gain-structure, is about 30.0 micrometers ($\mu$m) or less. Such a gain-structure may have as many as 15 active layers, and, accordingly, an optical thickness of about 10.5 $\mu$m. Accordingly, and air gap 52 between mirror 46 and gain-structure 32 would have a width of about 19.5 micrometers or less. An optical length C1 of about 6.0 millimeters (mm) between mirrors 34 and 40 would provide for a mode-frequency spacing of about 25 GHz. In FIG. 1, the length C2 is substantially exaggerated, compared with length C1, to simplify illustration.

A piezoelectric drive system 60 is attached to substrate 48 of mirror 46. Drive system 60 is arranged such that mirror 46 can be moved axially as indicated in FIG. 1 by double arrows A. The motion is preferably selected such that length C2 can be varied to an extent sufficient to tune the peak transmission wavelength (frequency) of etalon 47 across the gain bandwidth of gain-structure 32 between wavelengths (frequencies), within the gain bandwidth. The highest and lowest tuned frequencies would correspond to the highest and lowest frequencies of the channels (or a subset thereof) of the optical communication system. In the above-discussed example, a range of motion of about 7.0 nm would be required to tune etalon 47 between frequencies separated by 50 GHz. Tuning the etalon in this matter enables a desired oscillation frequency (laser output frequency) to be selected from the range of possible oscillation frequencies.

Figure 2:
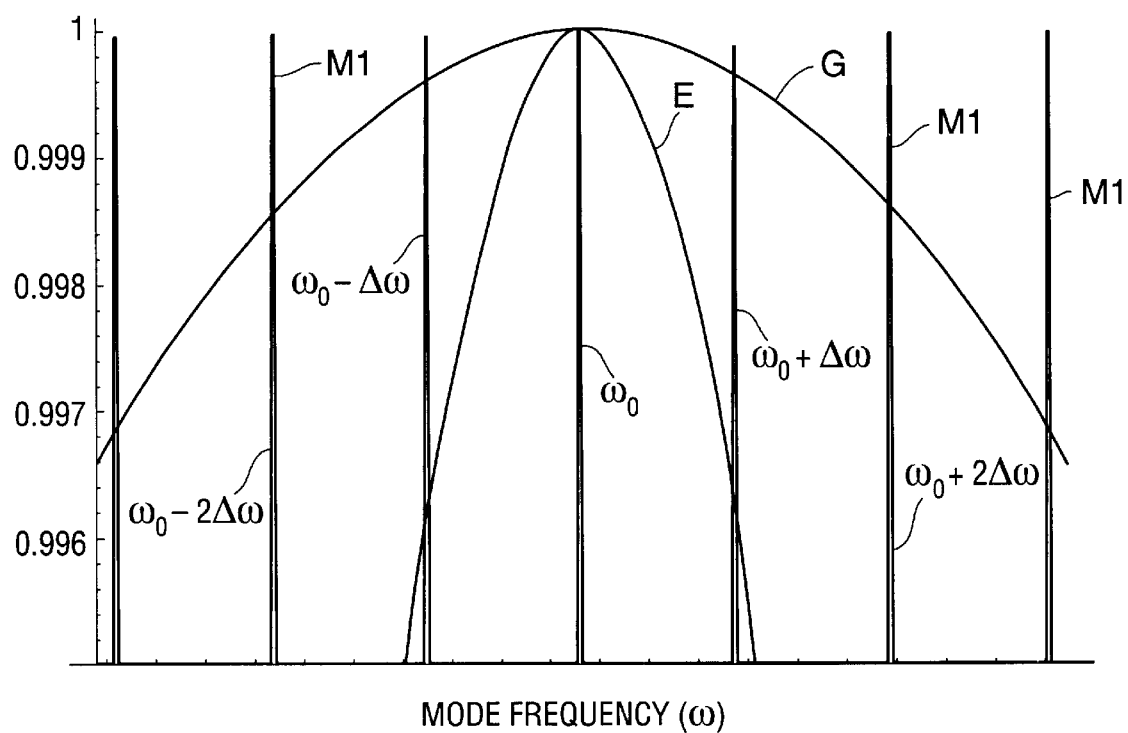
FIG. 2 is a graph schematically illustrating possible longitudinal oscillating modes of the resonator of FIG. 1 and estimated relative transmission as a function of frequency for the etalon of FIG. 1.

FIG. 2 schematically, graphically illustrates possible longitudinal oscillating modes (curves M1) of resonator 42, estimated relative transmission as a function of frequency of an etalon 47 (curve E), and estimated relative gain as a function of frequency (curve G) for gain-structure 32. In this example, optical length C1 is assumed to be 6.0 mm, distance C2 is assumed to be 30.0 $\mu$m, and gain-structure 32 is assumed to include active layers of InGaP having a peak gain at a wavelength of about 1532 nm (194,000 GHz). Mirror 34 is assumed to have a reflectivity of 99.9%, mirror 40 is assumed to have a reflectivity of 75.0%, and mirror 46 is also assumed to have a reflectivity of 75%. The peak of the relative-gain curve G and the peak transmission of the etalon curve E are aligned with a mode frequency $\omega_0$. Possible higher mode frequencies (in the absence of etalon 47) are $\omega_0+\Delta\omega$, $\omega_0+2\Delta\omega$, and so on, where $\Delta\omega$ is the channel-separation frequency, here, about 50 GHz. Possible lower mode frequencies (in the absence of etalon 47) are $\omega_0-\Delta\omega$, $\omega_0-2\Delta\omega$, and so on.

The relative gain for possible frequencies $\omega_0+\Delta\omega$ and $\omega-\Delta\omega$ compared with frequency $\omega_0$ is about 0.9998. This small difference in gain, in the absence of etalon 47 would be insufficient to select any one of the frequencies in preference to any other. Accordingly, resonator 42 could oscillate (lase) at any one of the frequencies at any time. The relative transmission of etalon 47 for possible frequencies $\omega_0+\Delta\omega$ and $\omega_0-\Delta\omega$ compared with frequency $\omega_0$ is about 0.9962. This translates to a relative loss of about 0.38%, which is sufficient to prevent possible frequencies $\omega_0+\Delta\omega$ and $\omega_0-\Delta\omega$ from oscillating. Etalon 47 causes even higher relative losses for higher and lower possible oscillating frequencies. This also prevents those frequencies from oscillating. Laser 30 can be tuned to select a particular channel frequency by moving mirror 46 such that the peak transmission frequency of etalon 47 lies between the next higher and lower frequencies to the selected channel frequency. The peak transmission frequency of etalon 47 need not necessarily be aligned precisely with the selected channel frequency. Indeed, some misalignment may be required in cases where the relative gains of the next higher and lower frequencies are not equal, i.e., for frequencies on the steeper slopes of the gain curve.

An important operation in manufacturing a laser such as laser 30 is the setting of distance C1. One preferred method of setting distance C1 is to secure heat sink 38 and components thereon to base 45 of the laser, while supporting substrate 41 of mirror 40 on a thin layer of thermally softened solder on base 45. Mirror 40 can be relatively simply positioned such that an initial distance C1 provides the required mode frequency spacing even though the mode frequencies may not be aligned, at this stage, with the channel frequencies. While delivering pump light P to gain-structure 32 for energizing gain-structure, precision micromanipulators can be used to align the mirror such that laser radiation F is generated in resonator 42. Output radiation $F_{(OUT)}$ can then be delivered to a spectrometer to measure the frequency of the output radiation. If necessary, the micromanipulators can then be activated to adjust the initial distance C1 such that the measured output frequency aligned with one of the channel frequencies. Once this frequency alignment is accomplished the solder can be allowed to set and secure mirror 40 in place on base 45. A method of bonding optical components to a base or substrate using a thermally softened or melted adhesive is described in U.S. Pat. No. 5,930,600, the complete disclosure of which is hereby incorporated by reference. Micromanipulators having sub micron accuracy are commercially available, for example, from Sutter Instruments Inc. of Novato, Calif.

Figure 3:
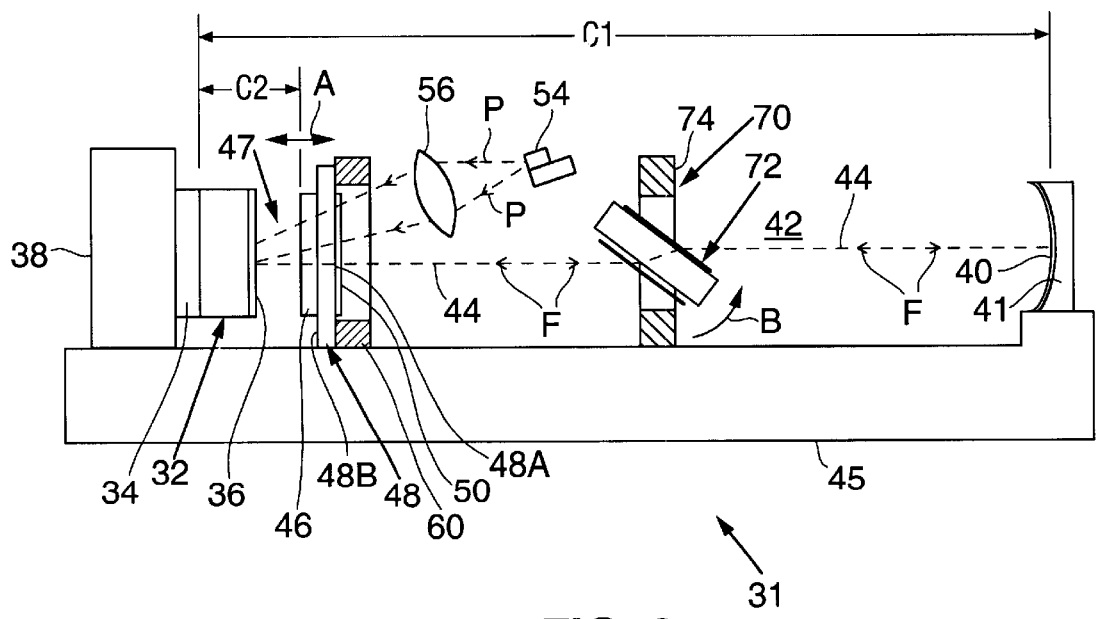
FIG. 3 schematically illustrates another preferred embodiment of a step-tunable OPS laser in accordance with the present invention, similar to the laser of FIG. 1, and further including a resonator-length adjusting plate for aligning longitudinal oscillating- mode frequencies of the laser with a desired range equally-spaced communications channel frequencies.

Referring out of FIG. 3 another embodiment 31 of a step-tunable laser in accordance with present invention includes all of the features of above-described laser 30 and also includes, in resonator 42, a device 70 for adjusting optical length C1. Distance adjuster 70 includes a transparent plate 72 held in a mount 74. Mount 74 is configured such that plate 72 can be selectively tilted with respect to axis 44, as indicated by arrow B, and then locked in position. Antireflection coatings 76 are provided for reducing resonator losses due to reflection from the plate. Alternatively, antireflection coatings 76 may be omitted and plate 72 tilted such that circulating radiation F is incident thereon at or close to Brewster's angle. For a fixed physical separation of mirrors 34 and 40, tilting plate 72 will change the path length of axis 44 in the plate. This, in turn, will change optical length C1 between the mirrors.

In a plate 72 having a thickness of about 0.5 mm, and initially tilted at an angle of about 56.0 degrees, a change in tilt angle of only about 0.2 degree is necessary to change optical length C1 by one half-wavelength at the wavelength of radiation F. This corresponds to changing the output frequency by the channel separation frequency $\Delta\omega$. Such a small change in tilt angle is not sufficient to cause any significant change in reflectivity of the plate for radiation F, whether antireflection coatings or a Brewster's angle surface are employed to reduce resonator losses.

In laser 31, optical length C1 is set by securing mirror 40 and heat sink 38 (and components thereon) to base 45 with mirror 40 aligned with mirror 34 to allow generation of laser radiation. The mirrors are spaced apart to provide an initial optical length C1 that provides the required mode-frequency spacing even though the mode frequencies may not be aligned at this stage with the channel frequencies. Pump light P is delivered to gain-structure 32 for energizing the gain-structure and generating laser radiation F. Output radiation $F_{(OUT)}$ can then be delivered to a spectrometer to measure the frequency of the output radiation. If necessary, plate 72 can be tilted to adjust the initial distance C1 such that the measured output frequency is aligned with one of the channel frequencies. Once the output frequency is aligned with the channel frequency plate 72 can be locked in position in mount 74.

Figure 4:
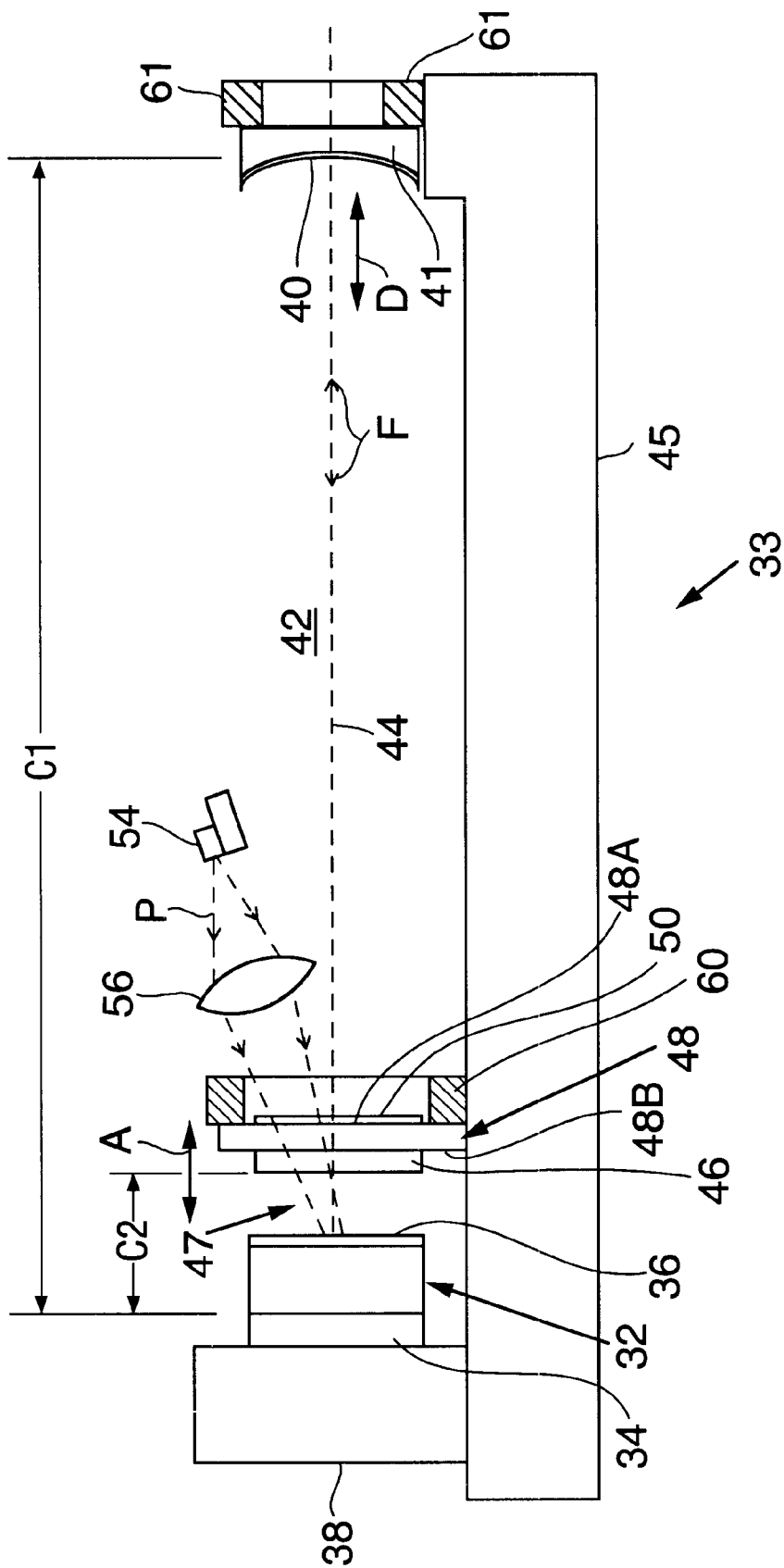
FIG. 4 schematically illustrates yet another preferred embodiment of a step-tunable OPS laser in accordance with the present invention, similar to the laser of FIG. 1 but wherein the second mirror is movable for adjusting the optical length of the resonator.

FIG. 4 schematically depicts still another embodiment 33 of a laser in accordance with the present invention including an arrangement for adjusting optical distance C1. Laser 33 is similar to above-described laser 30 with an exception that substrate 41 of mirror 40 is fixedly mounted via a piezoelectric actuators 61 to base 45. Distance C1 is set by securing piezo electric actuators 61 (and substrate 41 supported thereby) and heat sink 38 (and mirror 34 thereon) to base 45 with mirror 40 aligned with mirror 34 to allow generation of laser radiation. The mirrors are spaced apart to provide an initial optical length C1 that provides the required mode-frequency spacing. Pump light P is delivered to gain-structure 32 for energizing the gain-structure and generating laser radiation F. Output radiation $F_{(OUT)}$ can then be delivered to a spectrometer to measure the frequency of the output radiation. If necessary, a voltage can be applied to piezoelectric actuators 61 to move mirror 40 (as indicated by arrows D) for adjusting distance C1 until the measured output frequency is aligned with one of the channel frequencies. A disadvantage of the optical-length-adjusting arrangement of laser 33 is that means must be provided for continuously applying the voltage to piezoelectric actuators 61 to maintain alignment of the channel frequencies with the output frequencies of laser 33.

Figure 5:
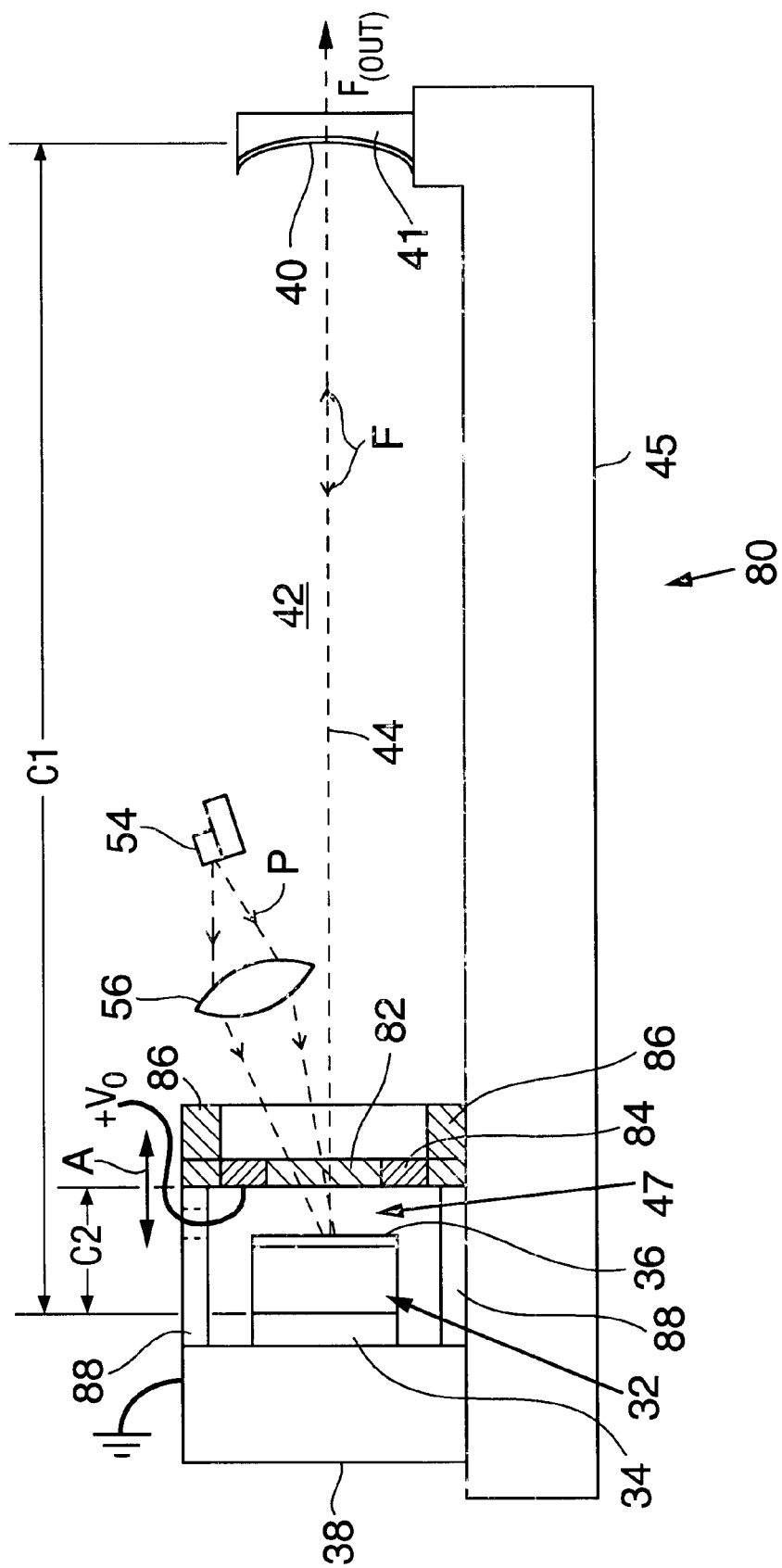
FIG. 5 schematically illustrates still another preferred embodiment of a step-tunable OPS laser in accordance with the present invention similar to the laser of FIG. 1 but wherein the partially-transmitting, movable, third mirror is an electrostatically-driven membrane mirror.

In above-described embodiments of the inventive step-tunable laser, etalon 47 is made tunable by moving a mirror 46 using a piezoelectric drive arrangement. Those skilled in the art, however, will recognize that other mirror drive arrangements may be provided without departing from the spirit and scope of the present invention. These drive arrangements may include but not be limited to electrostatic drives and magnetic drives. By way of example, a step-tunable laser in accordance with the present invention including an electrostatically-driven etalon-tuning mirror is schematically depicted in FIG. 5. Here, laser 80 has a base 45 supporting a mirror 40 and a mirror 34 and gain-structure 32 as described above in lasers 30 and 31. In laser 80, however, etalon 47 is formed by a membrane mirror 82 aligned parallel to mirror 34 and spaced apart therefrom. Membrane mirror 82, here shown in cross-section, has electrically conductive portions 84 and has a peripheral support 86. Spacers 88 are provided for establishing the general cavity width C2.

An electrostatic attraction is established by applying a positive potential to conductive portions 84 of membrane mirror 82 while heat sink 38 is held in ground potential. Electrostatic attraction deflects membrane mirror 82 toward the heat sink to a degree determined by the dimensions and flexibility of the membrane. Varying the positive potential varies electrostatic attraction and is used to move the mirror, as indicated by arrows A, for tuning etalon 47.

One limiting factor in extracting power from an external-cavity surface-emitting semiconductor laser is the amount of pump-light power that can be tolerated by the gain-structure in an area thereof corresponding to the area of an oscillating mode on the gain-structure. There will be some maximum tolerable power, dependent in part on the mode size (area) on the gain-structure, the efficiency of the heat sink that supports the gain-structure, and the thermal conductivity of the mirror located between the gain-structure and the heat sink.

Increasing the mode size on the gain-structure provides one-way of increasing extractable power for a given heat sink and mirror. A convenient way of increasing the mode size is to increase the optical length of the resonator. Increasing optical length of the resonator, however, increases the number of possible longitudinal oscillating modes for a given nominal output wavelength or frequency. This may result in the number of oscillating modes increasing to the point where the mode frequency separation is less than the channel frequency separation. If the number of oscillating modes is an integer multiple of the number of channels then, of course, there will be oscillating modes corresponding to each of the channel frequencies, however, there will be unwanted oscillating modes therebetween. Further, the mode spacing may be sufficiently close that a practical tunable etalon cannot provide sufficient discrimination between adjacent modes to guarantee selection of one of those modes for oscillation.

Figure 6:
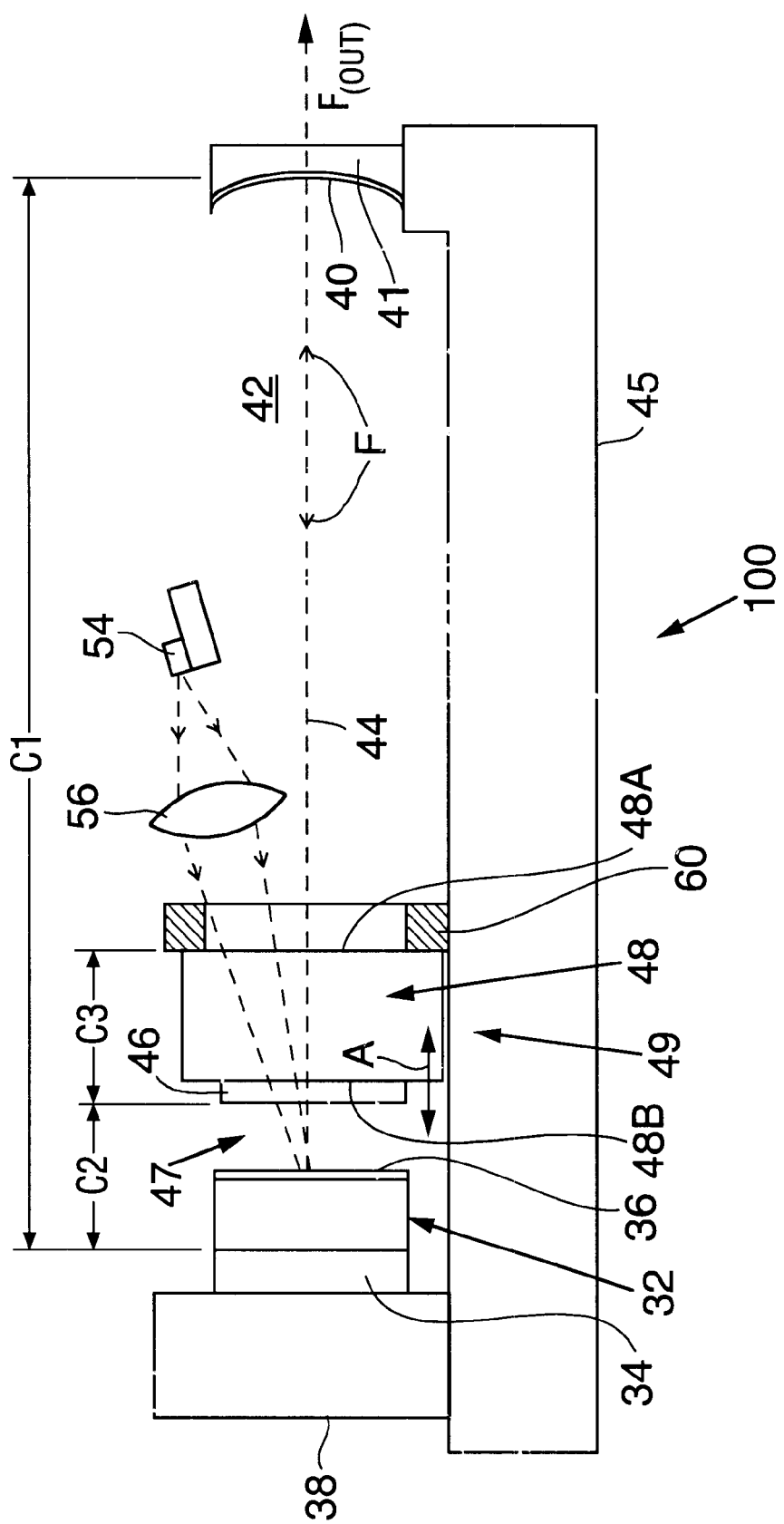
FIG. 6 schematically illustrates a further preferred embodiment of a step-tunable OPS laser in accordance with the present invention, similar to the laser of FIG. 1, including the third mirror and tunable etalon of FIG. 1, and further including a second etalon formed between the third mirror and a surface of a substrate on which the mirror is supported.

One preferred arrangement for suppressing such unwanted modes is described below with reference to FIG. 6. Here, still another embodiment of a step-tunable laser 100 in accordance with the present invention is schematically illustrated. Laser 100 is similar to laser 30 of FIG. 1 with an exception that substrate 48 supporting mirror 46 is configured to contribute substantially to the optical length C1 of resonator 42. The surface 48A of the substrate, opposite surface 48B thereof on which mirror 46 is supported, is not antireflection coated. Accordingly, surface 48A has a reflectivity (Fresnel reflectivity) determined by the refractive index of the material of substrate 48. This reflectivity would be about 4.25% for glass substrate having a refractive index of about 1.52.

Surfaces 48A and 48B of substrate 48 are made parallel to each other such that mirror 46 and surface 48A form a low finesse etalon 49 having a cavity of optical length C3. Length C3 is the thickness of substrate 48 multiplied by the refractive index of the material of substrate 48. The thickness of substrate 48 is selected such that cavity length C3 is a rational fraction or sub multiple of optical distance C1.

Figure 7:
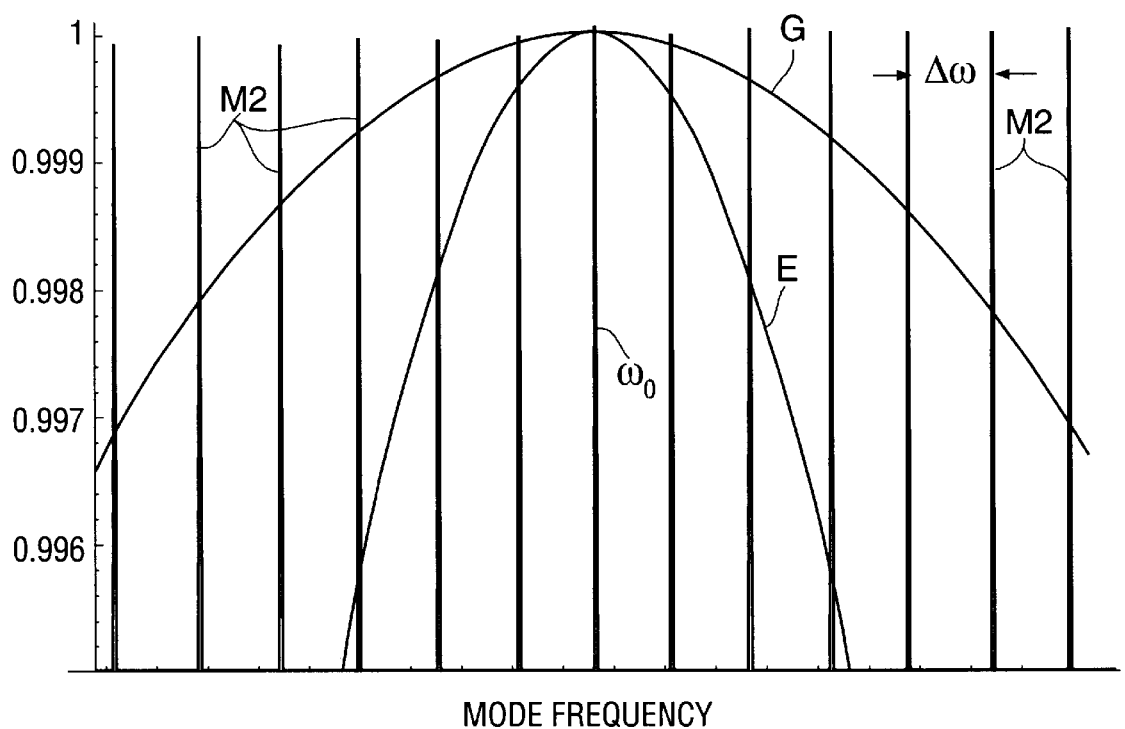
FIG. 7 is a graph schematically illustrating possible longitudinal oscillating modes of the resonator of FIG. 6.

The effect of this thickness selection is illustrated schematically in graphical form in FIG. 7. Here, curves M2 represent possible oscillating modes for a resonator 42 having an optical length C1 of about 12.0 mm. Curves G and E represent respectively the relative gain of gain-structure 32 as a function of frequency and the relative transmission of etalon 47 as a function of frequency. The possible oscillating modes have a frequency spacing $\Delta\omega$ of about 25 GHz. It can be seen that when the frequency of peak transmission of etalon 47 is aligned with a selected one (M2') of the possible mode frequencies, the transmission of the etalon for adjacent higher and lower frequency modes is about 0.9995 of the transmission for the selected mode frequency. The relative gain for the adjacent modes is greater than 0.9999 of the relative gain for the selected mode. Accordingly, any of the selected adjacent modes may oscillate, absent any measure to prevent this.

Figure 8:
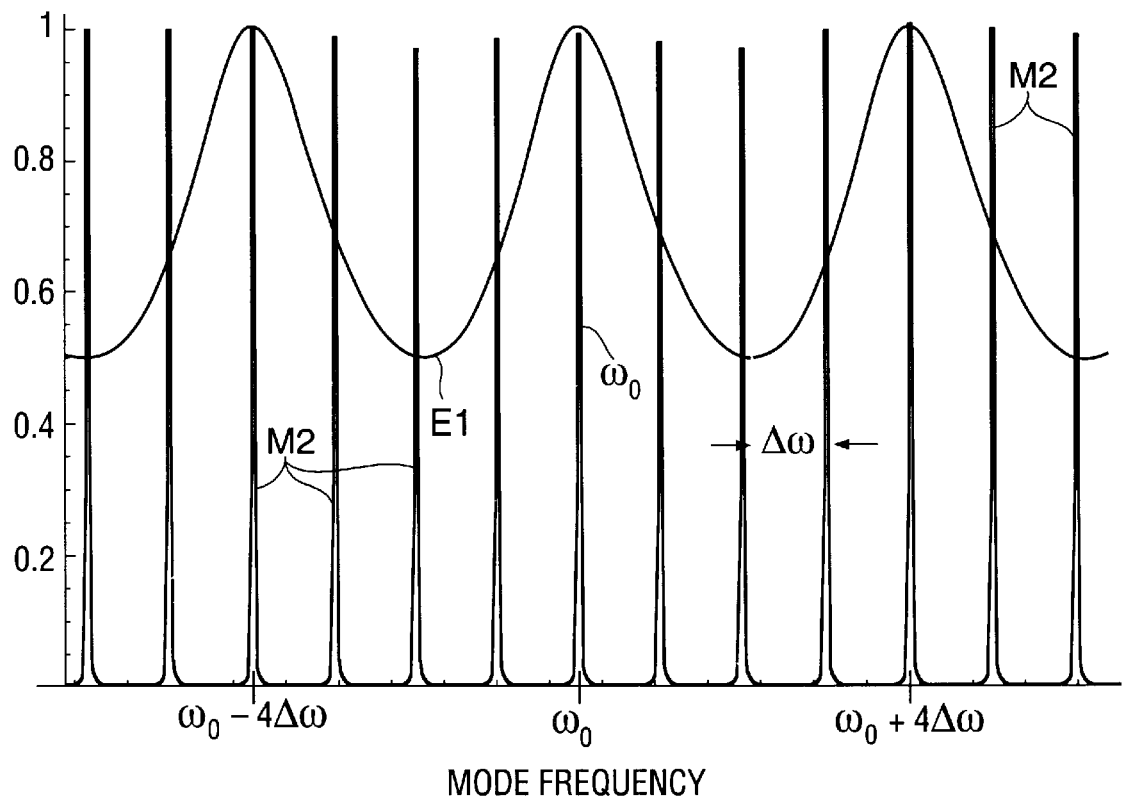
FIG. 8 is a graph schematically illustrating possible longitudinal oscillating modes of the resonator of FIG. 6 and estimated relative transmission as a function of frequency of the second etalon of FIG. 6.
Figure 9:
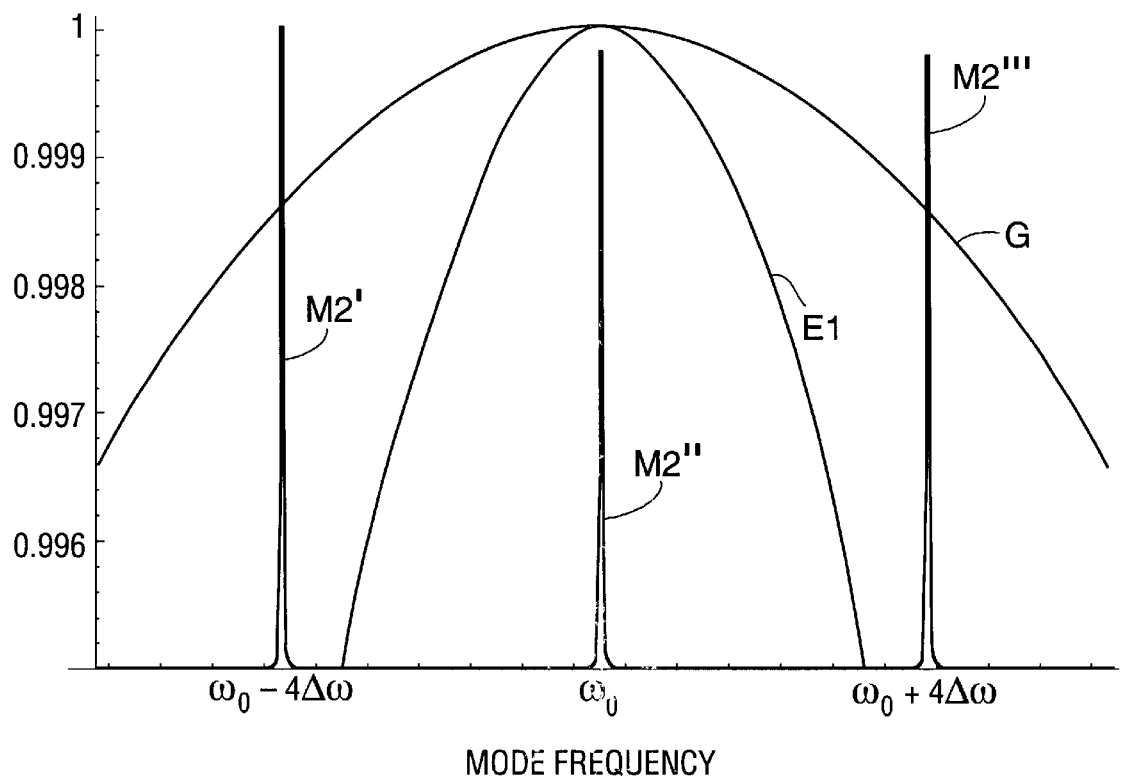
FIG. 9 is a graph schematically illustrating estimated relative transmission as a function of frequency of the tunable etalon of FIG. 6 and possible longitudinal oscillating modes of the resonator of FIG. 6 modified by the second etalon of FIG. 6.

The thickness of substrate 48 is selected such that cavity optical length C3 of etalon 49 is one-quarter of optical length C1. Optical length C3, of course, also contributes to optical length C1. In FIG. 8, curve E 1 schematically illustrates relative transmission as a function of frequency for such an etalon. Curves M2 represent the possible oscillating modes of resonator 42 as depicted in FIG. 7. A transmission peak frequency of etalon 49 is aligned with selected mode frequency $\omega_0$. In this case, other peak transmission frequencies of etalon 49 will be aligned with mode frequencies $\omega_0+4n\Delta\omega$ and $\omega_0-4n\Delta\omega$ where n is an integer. Transmission of intervening mode frequencies will be suppressed sufficiently that they cannot oscillate. Optical lengths C1 and C3 are selected such that the aligned mode frequencies correspond to the channel frequencies. FIG. 9 graphically depicts possible oscillating modes M2', M2", and M2"', having frequencies $\omega_0-4n\Delta\omega$, $\omega_0$, and $\omega_0-4n\Delta\omega$ respectively, together Curves E and G representing, respectively, relative transmission of etalon 47 and relative gain of gain-structure 32 as a function of frequency are also depicted. Here, the relative transmission of etalon 47 for possible oscillating modes M2' and M2" is sufficiently low to prevent those modes from oscillating.

Regarding manufacture of substrate 48, conventional grinding, optical polishing, and optical metrology techniques will be found sufficiently precise that the thickness of the substrate can be controlled initially with sufficient precision that that when one peak transmission frequency of etalon 49 is aligned with a selected channel frequency, other peak transmission frequencies of etalon 49 will align sufficiently closely with other channel frequencies that these frequencies can oscillate. These techniques, however, may not be sufficiently precise, in themselves, to accurately align any peak transmission frequency of etalon 49 with a selected channel frequency.

An accurate frequency alignment may be effected by measuring the wavelength location of adjacent transmission peaks of etalon 49 having a shorter and a longer wavelength than a selected channel wavelength. This will provide an indication of how much the thickness of etalon 49 must be reduced in order to align the longer wavelength peak with the selected channel wavelength. The thickness of the etalon can then be iteratively reduced until the wavelength alignment is obtained. Alternatively, the substrate optical thickness can be increased to align the shorter-wavelength peak with the selected channel wavelength. This can be accomplished by adding a layer of material to the substrate having the same refractive index as the material of the substrate. Such a layer of material can be added by vacuum deposition of the material. In either case, the fractional increase or decrease in the thickness of substrate 48 will be sufficiently small that its effect on the frequency separation of the transmission peaks of etalon 49 is negligible.

Figure 10:
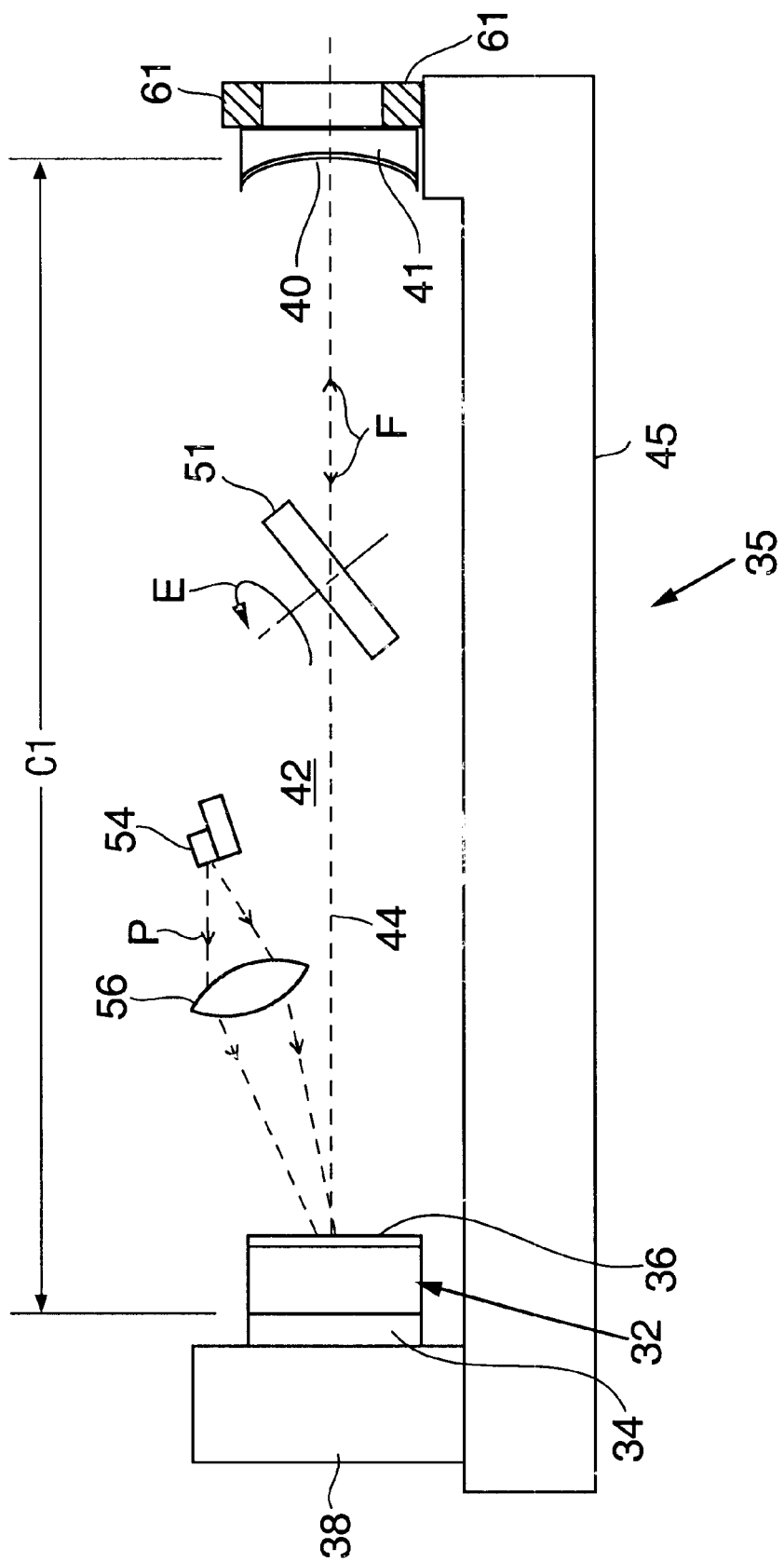
FIG. 10 schematically illustrates still yet another preferred embodiment of a step-tunable OPS laser in accordance with the present invention, similar to the laser of FIG. 4, but wherein the tunable etalon is replaced by a birefringent filter.

Referring now to FIG. 10, still yet another embodiment of 35 of laser in accordance with the present invention is illustrated. Laser 35 is similar to laser 33 of FIG. 4 with an exception that tunable etalon 47 of laser is replaced by a birefringent filter 51. Birefringent filter 51 serves the same purpose as etalon 47 inasmuch as it has a bandwidth selected such that it serves to select a particular one of the possible oscillating frequencies of laser resonator 42. Birefringent filter 51 is selectively rotatable as indicated by arrow E for selecting the particular oscillating frequency. Once the particular oscillating frequency has been selected, the birefringent filter can be locked in mount 53 to prevent accidental rotation of the birefringent filter to a position that will not allow the particular oscillating frequency to oscillate.

The present invention is described above in terms of a preferred and other embodiments. The invention is not limited, however, to those embodiments described and depicted herein. Rather, the invention is limited only by the claims appended hereto.

What is claimed is:

1. A laser for delivering laser radiation at a selected one of a plurality of equally-spaced frequencies extending over a frequency range, comprising:
   a laser resonator terminated by first and second mirrors;
   a surface-emitting semiconductor multilayer gain-structure located in said laser resonator in optical contact with said first mirror;
   a pumping arrangement for energizing said multilayer gain-structure and causing laser radiation to be generated in said laser resonator
   said laser resonator being configured such that said laser radiation can be generated at any time in only one of a plurality of possible longitudinal oscillating modes, said first and second mirrors being spaced apart by an optical distance selected such that the frequency and frequency-spacing of said possible longitudinal lasing modes of said laser resonator correspond with the plurality of equally-spaced frequencies;
   a first optical filter located in said laser resonator said optical filter being tunable for tuning said peak transmission frequency thereof; and
   wherein said first optical filter has a bandwidth arranged such that when said peak transmission frequency of said first optical filter is tuned to a value about equal to the selected one of the plurality of equally-spaced frequencies, said laser resonator delivers radiation in a single longitudinal mode only at said selected one of the plurality of equally-spaced frequencies.

2. The laser of claim 1, wherein said first optical filter is an etalon.

3. The laser of claim 2, wherein a third mirror is located in said laser resonator spaced-apart from said first mirror and said gain-structure, said etalon being formed by said first and third mirrors, and said etalon having a peak transmission frequency determined by the optical distance between said first and third mirrors, and wherein said third mirror is selectively movable with respect to said first mirror for tuning said peak transmission frequency of said etalon.

4. The laser of claim 1 wherein said first optical filter is a birefringent filter.

5. The laser of claim 4, wherein said birefringent filter is selectively rotatable for tuning said peak transmission frequency thereof.

6. The laser of claim 1, wherein one of said first and second mirrors is movable with respect to the other for adjusting the optical distance by which said first and second mirrors are spaced apart.

7. The laser of claim 6, wherein said second mirror is movable with respect to said first mirror.

8. The laser of claim 1, wherein said laser resonator configuration includes a second optical filter, and said first and second mirrors are spaced apart by a distance such that, in the absence of said second optical filter, oscillating modes of the resonator would be spaced apart by a submultiple frequency of said equally spaced frequencies and only a subset of said oscillating modes would corresponds to the plurality of equally-spaced frequencies, and wherein said second optical filter has a plurality of peak transmission frequencies corresponding to the plurality of equally-spaced frequencies and a bandwidth selected such that inclusion of said second filter in said laser resonator configuration allows only said subset of said oscillating modes to be said possible oscillating modes.

9. The laser of claim 8, wherein said second optical filter is an etalon.

10. The laser of claim 9, wherein a third mirror is supported on one of first and second opposite surfaces of a transparent substrate and said etalon is formed between said third mirror and the other of said first and second opposite surfaces of said substrate.

11. A laser for delivering laser radiation at a selected one of a plurality of equally-spaced frequencies extending over a frequency range, comprising:

a laser resonator terminated by first and second mirrors, said first and second mirrors having respectively first and second reflectivities, said first reflectivity being greater than said second reflectivity;

a surface-emitting semiconductor multilayer gain-structure located in said laser resonator in optical contact with said first mirror;

a pumping arrangement for energizing said multilayer gain-structure and causing laser radiation to be generated in said laser resonator;

said laser resonator being configured such that said laser radiation can be generated at any time in only one of a plurality of possible oscillating modes, said first and second mirrors being spaced apart by an optical distance selected such that the frequency and frequency-spacing of said possible longitudinal lasing modes of said laser resonator correspond with the plurality of equally-spaced frequencies;

a third mirror located in said laser resonator, said third mirror having a reflectivity about equal to or less than said second reflectivity and being spaced-apart from said first mirror and said gain-structure to form an etalon with said first mirror, said etalon having a peak transmission frequency determined by the optical distance between said first and third mirrors, said third mirror being movable with respect to said first mirror for tuning said peak transmission frequency of said etalon; and wherein, said etalon has a bandwidth arranged such that when said peak transmission frequency of said etalon is tuned to a value about equal to the selected one of the plurality of equally-spaced frequencies, said laser resonator delivers said laser radiation in a single longitudinal mode only at said selected one of the plurality of equally-spaced frequencies.

12. The laser of claim 11 wherein said third reflectivity is about equal to said second reflectivity.

13. The laser of claim 11 wherein one of said first and second mirrors is movable with respect to the other for adjusting the optical distance by which said first and second mirrors are spaced apart.

14. The laser of claim 13, wherein said second mirror is movable with respect to said first mirror.

15. The laser of claim 11, wherein said laser resonator configuration includes an optical filter, and said first and second mirrors are spaced apart by a distance such that in the absence of said second optical filter, oscillating modes of the resonator would be spaced apart by a submultiple frequency of said equally spaced frequencies and only a subset of said oscillating modes would corresponds to the plurality of equally-spaced frequencies, and wherein said optical filter has a plurality of peak transmission frequencies corresponding to the plurality of equally-spaced frequencies and a bandwidth selected such that inclusion of said second filter in said laser resonator configuration allows only said subset of said oscillating modes to be said possible oscillating modes.

16. The laser of claim 15, wherein said optical filter is an etalon.

17. The laser of claim 16, wherein a third mirror is supported on one of first and second opposite surfaces of a transparent substrate and said etalon is formed between said third mirror and the other of said first and second opposite surfaces of said substrate.

18. A laser for delivering laser radiation at a selected one of a plurality of equally-spaced frequencies extending over a frequency range, comprising:

a laser resonator terminated by first and second mirrors said first mirror having a reflectivity greater than the reflectivity of said second mirror;

a first optical filter located in said laser resonator;

a surface-emitting semiconductor-multilayer gain-structure located in said laser resonator in optical contact with said first mirror;

a pumping arrangement for energizing said multilayer gain-structure and causing laser radiation to be generated in said laser resonator;

said first and second mirrors being spaced apart by a first optical distance, said first optical distance and transmission properties of said first optical filter being selected such that said laser radiation can be generated in said resonator at any time in only one of a plurality of possible longitudinal oscillating modes, the frequency and frequency-spacing of said possible longitudinal lasing modes of said laser resonator corresponding with the plurality of equally-spaced frequencies;

a second optical filter located in said laser resonator, said second optical filter being tunable for tuning said peak transmission frequency thereof; and wherein, said second optical filter has a bandwidth arranged such that when said peak transmission frequency of said second optical filter is tuned to a value about equal to the selected one of the plurality of equally-spaced frequencies, said laser resonator delivers radiation in a single longitudinal mode only at said selected one of the plurality of equally-spaced frequencies.

19. The laser of claim 18, wherein said second optical filter is a first etalon.

20. The laser of claim 19, wherein a third mirror is located in said laser resonator, said third mirror having a reflectivity about equal to or less than the reflectivity of said second mirror and being spaced-apart from said first mirror and said gain-structure, said first and third mirrors forming a second etalon and defining said optical filter.

21. The laser of claim 20, wherein a peak transmission frequency of said second etalon is determined by a second optical distance between said first and third mirrors, and wherein said third mirror is movable with respect to said first mirror for tuning said peak transmission frequency of said second etalon.

* * * * *